United States Patent
Wang

(10) Patent No.: US 12,218,292 B2
(45) Date of Patent: Feb. 4, 2025

(54) POLARIZED-LIGHT-EMITTING SMD LED LAMP BEAD AND METHOD FOR BATCH MANUFACTURING THE SAME

(71) Applicants: Peng Wang, Henan (CN); Zhengzhou Shenglong Information Technology Co., Ltd., Henan (CN)

(72) Inventor: Peng Wang, Henan (CN)

(73) Assignee: Zhengzhou Shenglong Information Technology Co., Ltd., Zhengzhou (CN)

(*) Notice: Subject to any disclaimer, the term of this patent is extended or adjusted under 35 U.S.C. 154(b) by 205 days.

(21) Appl. No.: 17/532,189

(22) PCT Filed: Oct. 25, 2019

(86) PCT No.: PCT/CN2019/113267
§ 371 (c)(1),
(2) Date: Nov. 22, 2021

(87) PCT Pub. No.: WO2020/248470
PCT Pub. Date: Dec. 17, 2020

(65) Prior Publication Data
US 2023/0261155 A1    Aug. 17, 2023

(30) Foreign Application Priority Data
Jun. 11, 2019 (CN) .......................... 201910499653.1

(51) Int. Cl.
*H01L 33/58* (2010.01)
*H01L 25/075* (2006.01)

(52) U.S. Cl.
CPC .......... *H01L 33/58* (2013.01); *H01L 25/0753* (2013.01); *H01L 2933/0058* (2013.01)

(58) Field of Classification Search
CPC ................. H01L 33/58; H01L 25/0753; H01L 2933/0058
USPC .......................................................... 257/98
See application file for complete search history.

(56) References Cited

U.S. PATENT DOCUMENTS

2013/0015482 A1* 1/2013 Su .......................... H01L 33/58
257/E33.068

FOREIGN PATENT DOCUMENTS

| CN | 101629705 A | | 1/2010 |
|---|---|---|---|
| CN | 102750881 A | | 10/2012 |
| CN | 103048724 A | | 4/2013 |
| CN | 103216746 A | | 7/2013 |
| CN | 203071121 U | | 7/2013 |
| CN | 105702837 A | * | 6/2016 |
| CN | 205828422 U | * | 12/2016 |

(Continued)

OTHER PUBLICATIONS

International Search Report of PCT/CN2019/113267.
Written Opinion of PCT/CN2019/113267.

*Primary Examiner* — Phuc T Dang
(74) *Attorney, Agent, or Firm* — Westbridge IP LLC

(57) ABSTRACT

The invention relates to a polarized-light-emitting SMD (surface-mounted device) LED (light-emitting diode) lamp bead and a method of batch manufacturing the same; the LED lamp bead comprises an SMD LED lamp bead bracket and N LED light-emitting die(dice) on its inner bottom surface, wherein a polarizing film is horizontally disposed above the LED light-emitting die, and first light-transmitting glue is filled between the inner bottom surface of the bracket and the lower surface of the polarizing film.

7 Claims, 3 Drawing Sheets

(56) References Cited

FOREIGN PATENT DOCUMENTS

| CN | 107634134 | A |   | 1/2018  |        |            |
|----|-----------|---|---|---------|--------|------------|
| CN | 108682731 | A | * | 10/2018 | ......... | H01L 33/486 |
| CN | 109449272 | A |   | 3/2019  |        |            |
| CN | 110098179 | A |   | 8/2019  |        |            |
| CN | 209447798 | U | * | 9/2019  |        |            |
| JP | 2017122845| A | * | 7/2017  | ....... | G02F 1/133305 |

* cited by examiner

POLARIZED-LIGHT-EMITTING SMD LED LAMP BEAD AND METHOD FOR BATCH MANUFACTURING THE SAME

CROSS-REFERENCE TO RELATED APPLICATIONS

This application is a national stage application of PCT/CN2019/113267. This application claims priorities from PCT Application No. PCT/CN2019/113267, filed Oct. 25, 2019, and from the Chinese patent application 201910499653.1 filed Jun. 11, 2019, the content of which are incorporated herein in the entirety by reference.

TECHNICAL FIELD

The invention relates to an LED (light-emitting diode) lamp bead and a manufacturing method thereof, and in particular to a polarized-light-emitting SMD (surface-mounted device) LED lamp bead and a method for batch manufacturing the same.

BACKGROUND OF THE INVENTION

At present, LED display screens have been widely used in various aspects of people's work and life, bringing them colorful visual enjoyment. Among them, the stereoscopic LED display screen has had a particularly outstanding performance, which can bring people an immersive experience and is especially suitable for playing videos of various natural landscapes, science fiction and the like. The existing stereoscopic LED display screen displays stereoscopic images in a plurality of ways. In one way, a polarized stereoscopic LED display screen divides the display dot matrix of the LED display screen into a plurality of rows (columns), wherein all odd-numbered rows (columns) are used for displaying one image in the stereoscopic image, all even-numbered rows (columns) are used for displaying another image in the stereoscopic image, the LED surface of the odd-numbered rows (columns) are mounted with polarizing films in the same polarization direction, and the LED surface of all even-numbered rows (columns) are mounted with polarizing films in the polarization direction opposite to the odd-numbered rows (columns); in another way, the polarization direction of the display dot matrix of a stereoscopic LED display screen is in an odd-even array format, or called checkerboard, that is, the first row is polarized "leftward, rightward, leftward, rightward, . . . " and the second row is polarized "rightward, leftward, rightward, leftward, . . . ", which are repeated in such a way that polarizing films in different polarization directions need be mounted alternately onto the display dot matrix of this stereoscopic LED display screen; and the said two stereoscopic LED display screens can simultaneously display images in two different polarization directions when working, and a viewer can see vivid stereoscopic images when wearing stereoscopic glasses. In the actual production of stereoscopic LED display screens, polarizing films need be pasted onto the surface of the display screen row by row (column by column) or one by one, and the polarization direction of the polarizing films cannot be mistaken, whereby the workload is huge, the production efficiency is low (especially for checkerboard stereoscopic LED display screens, which are almost impossible to be produced), the yield rate is low, and the quality is hardly guaranteed.

SUMMARY OF THE INVENTION

The present invention is technically dedicated to: providing a polarized-light-emitting SMD LED lamp bead and a method for batch manufacturing the same. The SMD LED lamp bead can emit polarized light, the procedures of manufacturing a stereoscopic LED display screen are reduced, and the method of batch manufacturing the SMD LED lamp beads allows the SMD LED lamp beads in the same polarization direction to be taped together according to the same position and direction, whereby the SMD LED lamp beads in the same polarization direction can be easily soldered in the same row (column) or soldered alternately when a stereoscopic LED display screen is manufactured, and the production efficiency of stereoscopic LED display screens will be improved.

The technical scheme of the present invention is as follows:

A polarized-light-emitting SMD LED lamp bead (TOP type), comprising an SMD LED lamp bead bracket and N LED light-emitting die(dice), wherein N is a natural number greater than or equal to 1, the N LED light-emitting die(dice) are disposed on the inner bottom surface of the SMD LED lamp bead bracket, a polarizing film is horizontally disposed above the N LED light-emitting die(dice), and a gap between the inner bottom surface of the SMD LED lamp bead bracket and the lower surface of the polarizing film is filled with cured first light-transmitting glue.

The upper surface of the polarizing film is covered with a layer of cured second light-transmitting glue or a light-transmitting film.

The second light-transmitting glue is made of epoxy resin, silica gel, UV glue or other light-transmitting filling materials; and the light-transmitting film is an AGAR film.

When the LED light-emitting die is a normal die, the N LED light-emitting die(dice) is(are) fixed onto the inner bottom surface of the SMD LED lamp bead bracket with conductive glue or insulating glue and is(are) connected to the inner bottom surface of the SMD LED lamp bead bracket with wires which are disposed below the polarizing film; the conductive glue is silver glue; and the wires are gold, alloy, copper or other metal wires;

When the LED light-emitting die is a flip-chip die, the N LED light-emitting die(dice) is(are) soldered onto the inner bottom of the SMD LED lamp bead bracket.

N is 1~3; the first light-transmitting glue is made of epoxy resin, silica gel or other light-transmitting filling materials; the polarizing film is a leftward, rightward or linear polarizing film; and the polarizing film is disposed inside or outside the SMD LED lamp bead bracket.

A method of batch manufacturing the polarized-light-emitting SMD LED lamp beads (TOP type), comprising the following steps:

Step 1: mounting N LED light-emitting die(dice) onto the inner bottom surface of each SMD LED lamp bead bracket in an SMD LED lamp bead bracket matrix, and connecting the electrodes of the N LED light-emitting die(dice) with the conductive area on the inner bottom surface of the SMD LED lamp bead bracket to form an electric path, wherein N is a natural number greater than or equal to 1; and interconnecting all the SMD LED lamp bead brackets in the SMD LED lamp bead bracket matrix, wherein each SMD LED lamp bead bracket is labeled with a direction-signifying mark;

Step 2: preheating the semi-finished product formed in Step 1;

preheating is performed in an oven or a drying box to preheat the semi-finished product formed in Step 1 to a proper temperature, such that the first light-transmitting glue is better combined with the SMD LED lamp bead bracket to avoid the production of bubbles and other impurities in the packaging process;

Step 3: filling first light-transmitting glue into each SMD LED lamp bead bracket with a glue dispenser until the N LED light-emitting die(dice) is(are) immersed in the first light-transmitting glue, wherein the surface of the first light-transmitting glue is kept horizontal;

Step 4: baking the semi-finished product formed in Step 3 to cure the first light-transmitting glue filled in each SMD LED lamp bead bracket;

Step 5: extracting a small piece of polarizing film from a polarizing film matrix with a surface mounter, and pasting it onto the surface of the first light-transmitting glue in the SMD LED lamp bead bracket to form a polarizing film on the surface of the first light-transmitting glue;

a polarizing film matrix is made of a whole polarizing film with a first bottom film, wherein the whole polarizing film is pasted to the first bottom film via the glue on the lower surface of the polarizing film. The method of manufacturing a polarizing film matrix comprises the following steps: placing a whole polarizing film with a first bottom film into a cutter, cutting the whole polarizing film into neatly-aligned small pieces of polarizing film according to a preset program, and forming a polarizing film matrix, wherein each small piece of polarizing film in the polarizing film matrix matches the SMD LED lamp bead bracket in terms of shape and size (the small piece of polarizing film may be a square, rectangular, circular, or polygonal piece with a surface area varying from about 0.1 square millimeter to over ten square millimeters), the first bottom film remains uncut and the polarizing film matrix remains pasted to the upper surface of the first bottom film;

when selecting a whole polarizing film with a first bottom film, the first bottom film with too strong adhesion to the whole polarizing film should be excluded such that the extraction of the small polarizing film pieces is not impacted;

when cutting a whole polarizing film, the cutting depth of the cutter should be controlled to avoid cutting the first bottom film and to keep its integrity;

Step 6: disconnecting the SMD LED lamp bead brackets from each other to form independent SMD LED lamp beads;

Step 7: binning the SMD LED lamp beads into different types with a splitter;

by setting various parameters (brightness, voltage, color temperature, luminous flux, etc.) on the splitter, the SMD LED lamp beads can be binned into a plurality of classes and models;

Step 8: taping different types of SMD LED lamp beads separately with a taping machine.

As the SMD LED lamp bead bracket is labeled with a direction-signifying mark, the taped SMD LED lamp beads are in the same polarization direction.

In Step 5, the first bottom film is an expandable film, and after the polarizing film matrix is made, the expandable film is uniformly expanded with an expander to evenly separate the small pieces of polarizing film densely attached to the surface of the expandable film, which makes it easier to extract the small polarizing film pieces.

The following operations are added between Step 5 and Step 6: coating the polarizing film in each SMD LED lamp bead bracket with a layer of second light-transmitting glue by a glue dispenser, and baking it or exposing it to ultraviolet rays to cure the second light-transmitting glue in the SMD LED lamp bead bracket, wherein the second light-transmitting glue not only transmits light, but also protects the polarizing film.

The second light-transmitting glue is made of epoxy resin, silica gel or UV glue; and the epoxy resin and silica gel are cured through baking while the UV glue is cured with ultraviolet irradiation.

As the polarizing film will be depolarized, that is, the polarity is lost, when temperature exceeds a certain value, the temperature and duration during the baking process should be precisely controlled according to the features of the polarizing film and cannot exceed its tolerable temperature and duration.

Alternatively, the following operations are added between Step 5 and Step 6: extracting a small piece of light-transmitting film from a light-transmitting film matrix with a surface mounter, and pasting it onto the polarizing film on the SMD LED lamp bead bracket to form a light-transmitting film on the surface of the polarizing film;

a light-transmitting film matrix is made of a whole light-transmitting film with a second bottom film, wherein the whole light-transmitting film is pasted to the second bottom film via the glue on the lower surface of the light-transmitting film, and the method of manufacturing the light-transmitting film matrix comprises the following steps: placing a whole light-transmitting film with a second bottom film into a cutter, cutting the whole light-transmitting film into neatly-aligned small pieces of light-transmitting film according to a preset program, and forming a light-transmitting film matrix, wherein each small piece of light-transmitting film in the light-transmitting film matrix matches the SMD LED lamp bead bracket in terms of shape and size, the second bottom film remains uncut and the light-transmitting film matrix remains pasted to the upper surface of the second bottom film.

When selecting a whole light-transmitting film with a second bottom film, the second bottom film with too strong adhesion to the whole light-transmitting film should be excluded such that the extraction of the small light-transmitting film pieces is not impacted.

When cutting a whole light-transmitting film, the cutting depth of the cutter should be controlled to avoid cutting the second bottom film and to keep its integrity;

and the light-transmitting film not only transmits light, but also protects the polarizing film.

The light-transmitting film is an AGAR film.

When the LED light-emitting die is a normal die, the detailed method of Step 1 is:

Step 1.1: making preparations, including die film expanding, cleaning and baking, and warming;

die film expanding: as an LED light-emitting die is tiny (for example 4 μm*6 μm), the surface of an LED light-emitting die film supplied by its manufacturers is densely covered with tens of thousands of LED light-emitting dice; the tiny space between the LED light-emitting dice makes it difficult to extract an LED light-emitting die, therefore a die film expander is applied to expand an LED light-emitting die film uniformly, such that the LED light-emitting dice densely attached to the surface of the LED light-emitting die film are evenly separated, which will be easy to extract and use. A die film expander, which is also called a die expander or a chip expander, has been extensively applied in a die expanding process of manufacturing light-emitting diodes, medium-and-small-power triodes, backlight, integrated circuits and some special semiconductor devices. Based on the plasticity of an LED light-emitting die film when heated, a die film expander, which adopts double-cylinder up-and-down control, evenly spreads out an LED light-emitting die film, wherein the die film is automatically reshaped once the desired space between dice is acquired, and the film is tightened yet not deformed;

cleaning and baking: a plasma cleaning machine is applied to perform plasma cleaning on the SMD LED lamp bead bracket matrix, wherein the residual organic substance on the surface of the SMD LED lamp bead bracket matrix is removed with an electric arc formed by hydrogen and oxygen inside the plasma cleaning machine to improve the adhesion of the LED light-emitting die, and then the SMD LED lamp bead bracket matrix is baked in an oven to remove the residual water vapor on its surface which is generated in the injection molding process;

warming: the conductive glue or the insulating glue which has been stored in a refrigerator is taken out and left to stand in the air to warm to room temperature; and the conductive glue is silver glue;

Step 1.2: die bonding, also called chip mounting. A die bonder is used to fix an LED light-emitting die of the LED light-emitting die film onto a designated position on the inner bottom surface of each SMD LED lamp bead bracket in the SMD LED lamp bead bracket matrix via the conductive glue or insulating glue to form a thermal path or an electric path, laying the foundation for the subsequent wire bonding;

Step 1.3: bonded-die baking. The semi-finished product formed in Step 1.2 is baked in an oven or a drying box, wherein the conductive glue or insulating glue is baked and cured to establish a strong bond between the LED light-emitting die and the SMD LED lamp bead bracket; alternatively, the glue can be cured naturally, but it takes time;

Step 1.4: soldering wires in each SMD LED lamp bead bracket with a wire bonder (also called bonding or wire bonding) and connecting the electrodes of the N LED light-emitting die(dice) with the conductive area on the inner bottom surface of the SMD LED lamp bead bracket to form an electric path, wherein the wires are gold, alloy, copper or other metal wires;

When the LED light-emitting die is a flip-chip die, the detailed method of Step 1 is: soldering the N LED light-emitting die(dice) directly onto the inner bottom surface of the SMD LED lamp bead bracket, and soldering the electrodes of the N LED light-emitting die(dice) with the conductive area on the inner bottom surface of the SMD LED lamp bead bracket to form an electric path;

in Step 3, the wires are immersed in the first light-transmitting glue;

before Step 6 is taken, an LED tester is applied to check and test the function of the SMD LED lamp beads;

Step 6 is completed with a cutting die or a punch press;

after Step 8 is completed, a vacuum packaging machine is applied to vacuum package the SMD LED lamp beads which have been taped;

the cutter is a laser or mechanical cutter;

the first light-transmitting glue is made of epoxy resin, silica gel or other light-transmitting filling materials, and the polarizing film is a leftward, rightward or linear polarizing film;

and N is 1~3.

Alternatively, a method of batch manufacturing the polarized-light-emitting SMD LED lamp beads (TOP type), comprising the following steps:

Step 21: mounting N LED light-emitting die(dice) onto the inner bottom surface of each SMD LED lamp bead bracket in an SMD LED lamp bead bracket matrix, and connecting the electrodes of the N LED light-emitting die(dice) with the conductive area on the inner bottom surface of the SMD LED lamp bead bracket to form an electric path, wherein N is a natural number greater than or equal to 1; and interconnecting all the SMD LED lamp bead brackets in the SMD LED lamp bead bracket matrix, wherein each SMD LED lamp bead bracket is labeled with a direction-signifying mark;

Step 22: preheating the semi-finished product formed in Step 21;

Step 23: filling first light-transmitting glue into each SMD LED lamp bead bracket with a glue dispenser until the N LED light-emitting die(dice) is(are) immersed in the first light-transmitting glue, wherein the surface of the first light-transmitting glue is kept horizontal;

Step 24: placing a small piece of polarizing film from a taped polarizing film onto the surface of the first light-transmitting glue in the SMD LED lamp bead bracket with a surface mounter to form a polarizing film on the surface of the first light-transmitting glue, wherein the height of the surface of the first light-transmitting glue allows the polarizing film to be disposed inside the SMD LED lamp bead bracket;

The method of manufacturing a taped polarizing film comprises the following steps: placing a whole polarizing film without glue on the front and back surfaces into a cutter, cutting the whole polarizing film into small pieces of polarizing film with the same size according to a preset program, wherein each small piece of polarizing film in the polarizing film matrix matches the SMD LED lamp bead bracket in terms of shape and size (the small piece of polarizing film may be a square, rectangular, circular, or polygonal piece with a surface area varying from about 0.1 square millimeter to over ten square millimeters) and is labeled with a direction-signifying mark, and then taping all the small polarizing film pieces with a taping machine to form a taped polarizing film; and the direction-signifying marks can ensure that all the taped polarizing films have the same polarization direction during the taping process, such that the polarizing films mounted in each SMD LED lamp bead bracket with the surface mounter have the same direction;

Step 25: coating the polarizing film in each SMD LED lamp bead bracket with a layer of second light-transmitting glue by a glue dispenser, and baking it or exposing it to ultraviolet rays to cure the second light-transmitting glue in the SMD LED lamp bead bracket; and the second light-transmitting glue not only transmits light, but also fixes and protects the polarizing film;

As the polarizing film will be depolarized, that is, the polarity is lost, when temperature exceeds a certain value, the temperature and duration during the baking process should be precisely controlled according to the features of the polarizing film and cannot exceed its tolerable temperature and duration;

Step 26: disconnecting the SMD LED lamp bead brackets from each other to form independent SMD LED lamp beads;

Step 27: binning the SMD LED lamp beads into different types with a splitter;

by setting various parameters (brightness, voltage, color temperature, luminous flux, etc.) on the splitter, the SMD LED lamp beads can be binned into a plurality of classes and models;

Step 28: taping different types of SMD LED lamp beads separately with a taping machine.

When the LED light emitting die is a normal die, the detailed method of Step 21 is:

Step 21.1: making preparations, including die film expanding, cleaning and baking, and warming;

die film expanding: a die film expander is applied to expand an LED light-emitting die film uniformly, such that the LED light-emitting dice densely attached to the surface of the LED light-emitting die film are evenly separated;

cleaning and baking: a plasma cleaning machine is applied to perform plasma cleaning on the SMD LED lamp bead bracket matrix, wherein the residual organic substance on the surface of the SMD LED lamp bead bracket matrix is removed, and then the SMD LED lamp bead bracket matrix is baked in an oven to remove the water vapor on its surface;

warming: the conductive glue or insulating glue which has been stored in a refrigerator is taken out and left to stand in the air to warm to room temperature; and the conductive glue is silver glue;

Step 21.2: die bonding. A die bonder is used to fix an LED light-emitting die of the LED light-emitting die film onto a designated position on the inner bottom surface of each SMD LED lamp bead bracket in the SMD LED lamp bead bracket matrix via conductive glue or insulating glue;

Step 21.3: bonded-die baking. The semi-finished product formed in Step 21.2 is baked in an oven or a drying box, wherein the conductive glue or insulating glue is baked and cured to establish a strong bond between the LED light-emitting die and the SMD LED lamp bead bracket;

Step 21.4: soldering wires in each SMD LED lamp bead bracket with a wire bonder and connecting the electrodes of the N LED light-emitting die(dice) with the conductive area on the inner bottom surface of the SMD LED lamp bead bracket to form an electric path, wherein the wires are gold, alloy, copper or other metal wires;

When the LED light-emitting die is a flip-chip die, the detailed method of Step 21 is: soldering the N LED light-emitting die(dice) directly onto the inner bottom surface of the SMD LED lamp bead bracket, and soldering the electrodes of the N LED light-emitting die(dice) with the conductive area on the inner bottom surface of the SMD LED lamp bead bracket to form an electric path;

in Step 23, the wires are immersed in the first light-transmitting glue;

in Step 24, the direction-signifying mark on the small polarizing film pieces is a through hole or/and a notch;

before Step 26 is taken, an LED tester is applied to check and test the function of the SMD LED lamp beads;

Step 26 is completed with a cutting die or punch press;

after Step 28 is completed, a vacuum packaging machine is applied to vacuum package the SMD LED lamp beads which have been taped;

the cutter is a laser or mechanical cutter;

the first light-transmitting glue is made of epoxy resin, silica gel or other light-transmitting filling materials, and the polarizing film is a leftward, rightward or linear polarizing film;

the first light-transmitting glue can be cured naturally in a long period of time without baking;

the second light-transmitting glue is made of epoxy resin, silica gel, UV glue or other light-transmitting filling materials; and the epoxy resin and the silica gel are cured by baking while the UV glue is cured by ultra-violet irradiation;

and N is 1~3.

The invention has the following beneficial effects:

1. The SMD LED lamp bead of the invention has a polarizing film, which can emit polarized light by itself when it is working. When the SMD LED lamp bead is applied to manufacture a stereoscopic LED display screen, no additional polarizing film need be mounted onto the surface of the LED lamp bead, thus reducing the manufacturing procedures, wherein the manufacturing method is simple and easy, the production efficiency of stereoscopic LED display screens will be effectively increased, and the quality and yield rate of the products will be significantly improved.

2. When an SMD LED lamp bead is manufactured according to the present invention, first light-transmitting glue is first of all filled into the SMD LED lamp bead bracket, and a surface mounter is then used to pick in an orderly manner from a polarizing film matrix a small piece of polarizing film which is cut from a whole polarizing film and to paste it onto the surface of the first light-transmitting glue in the SMD LED lamp bead bracket, or a surface mounter is used to place from a taped polarizing film a small piece of polarizing film onto the surface of the first light-transmitting glue in the SMD LED lamp bead bracket; therefore, the SMD LED lamp beads manufactured according to the invention in the same batch have the same polarization direction, and in the subsequent taping process the SMD LED lamp beads in the same polarization direction can be taped together according to the same position and direction, such that the SMD LED lamp beads in the same polarization direction may be soldered on the same row (column) or soldered alternately when manufacturing a stereoscopic LED display screen, thereby improving the production efficiency of stereoscopic LED display screens and especially making the impossible possible regarding the production of stereoscopic LED display screens with the "checkerboard" polarization.

3. According to the present invention, the method of batch manufacturing SMD LED lamp beads adopts a production line, thereby yielding high production efficiency and product quality.

DETAILED DESCRIPTION OF EMBODIMENTS

Embodiment 1

Figure 1:
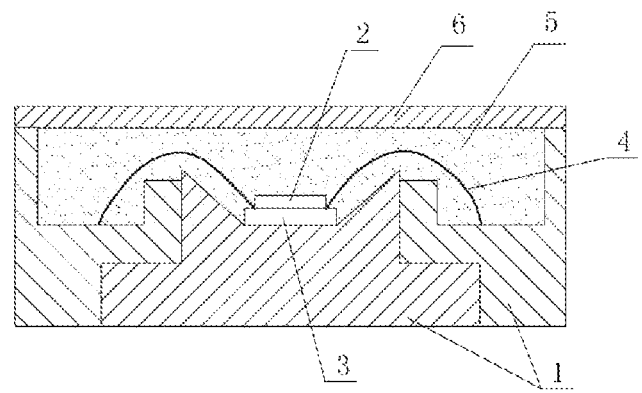
FIG. 1 is a first schematic structure diagram of a polarized-light-emitting SMD LED lamp bead.

Referring to FIG. 1, a polarized-light-emitting SMD LED lamp bead (TOP type) comprises an SMD LED lamp bead bracket 1 and an LED light-emitting die 2, wherein the LED light-emitting die 2 is disposed on the inner bottom surface of the SMD LED lamp bead bracket 1, a polarizing film 6 is horizontally disposed above the LED light-emitting die 2, and a gap between the inner bottom surface of the SMD LED lamp bead bracket 1 and the lower surface of the polarizing film 6 is filled with cured first light-transmitting glue 5.

The LED light-emitting die 2 is a normal die and is fixed onto the inner bottom surface of the SMD LED lamp bead bracket 1 through insulating glue 3, wherein two wires 4 connect the LED light-emitting die 2 with the inner bottom surface of the SMD LED lamp bead bracket 1 and are disposed below the polarizing film 6; the wires 4 are gold wires; and the two electrodes of the LED light-emitting die 2 are respectively connected to the inner bottom surface of the SMD LED lamp bead bracket 1 through two wires 4.

The first light-transmitting glue 5 is made of epoxy resin; and the polarizing film 6 is a leftward polarizing film, which is disposed outside the SMD LED lamp bead bracket 1.

The method of batch manufacturing the polarized-light-emitting SMD LED lamp beads (TOP type) comprises the following steps:

Step 1: mounting an LED light-emitting die 2 onto the inner bottom surface of each SMD LED lamp bead bracket 1 in an SMD LED lamp bead bracket matrix, and connecting the electrodes of the LED light-emitting die 2 with the conductive area on the inner bottom surface of the SMD LED lamp bead bracket 1 to form an electric path; and interconnecting all the SMD LED lamp bead brackets 1 in the SMD LED lamp bead bracket matrix, wherein each SMD LED lamp bead bracket 1 is labeled with a direction-signifying mark;

Step 2: preheating the semi-finished product formed in Step 1;

preheating is performed in an oven or a drying box to preheat the semi-finished product formed in Step 1 to a proper temperature, such that the first light-transmitting glue 5 is better combined with the SMD LED lamp bead bracket 1 to avoid the production of bubbles and other impurities in the packaging process;

Step 3: filling first light-transmitting glue 5 into each SMD LED lamp bead bracket 1 with a glue dispenser until the LED light-emitting die 2 is immersed in the first light-transmitting glue 5, wherein the surface of the first light-transmitting glue 5 is kept horizontal;

Step 4: baking the semi-finished product formed in Step 3 to cure the first light-transmitting glue 5 filled in each SMD LED lamp bead bracket 1;

Step 5: extracting a small piece of polarizing film from a polarizing film matrix with a surface mounter, and pasting it onto the surface of the first light-transmitting glue 5 in the SMD LED lamp bead bracket 1 to form a polarizing film 6 on the surface of the first light-transmitting glue;

a polarizing film matrix is made of a whole polarizing film with a first bottom film, wherein the whole polarizing film is pasted to the first bottom film via the glue on the lower surface of the polarizing film. The method of manufacturing a polarizing film matrix comprises the following steps: placing a whole polarizing film with a first bottom film into a cutter, cutting the whole polarizing film into neatly-aligned small pieces of polarizing film according to a preset program, and forming a polarizing film matrix, wherein each small piece of polarizing film in the polarizing film matrix matches the SMD LED lamp bead bracket 1 in terms of shape and size (the small piece of polarizing film is a square piece with a surface area of 2 square millimeters), the first bottom film remains uncut and the polarizing film matrix remains pasted to the upper surface of the first bottom film;

when selecting a whole polarizing film with a first bottom film, the first bottom film with too strong adhesion to the whole polarizing film should be excluded such that the extraction of the small polarizing film pieces is not impacted;

when cutting a whole polarizing film, the cutting depth of the cutter should be controlled to avoid cutting the first bottom film and to keep its integrity;

Step 6: disconnecting the SMD LED lamp bead brackets 1 from each other to form independent SMD LED lamp beads;

Step 7: binning the SMD LED lamp beads into different types with a splitter; by setting various parameters (brightness, voltage, color temperature, luminous flux, etc.) on the splitter, the SMD LED lamp beads can be binned into a plurality of classes and models;

Step 8: taping different types of SMD LED lamp beads separately with a taping machine.

As the SMD LED lamp bead bracket 1 is labeled with a direction-signifying mark, the taped SMD LED lamp beads are in the same polarization direction.

In Step 5, the first bottom film is an expandable film, and after the polarizing film matrix is made, the expandable film is uniformly expanded with an expander to evenly separate the small pieces of polarizing film densely attached to the surface of the expandable film, which makes it easier to extract the small polarizing film pieces.

The detailed method of Step 1 is:

Step 1.1: making preparations, including die film expanding, cleaning and baking, and warming;

die film expanding: as an LED light-emitting die 2 is tiny (for example 4 μm*6 μm), the surface of an LED light-emitting die film supplied by its manufacturers is densely covered with tens of thousands of LED light-emitting dice 2; the tiny space between the LED light-emitting dice 2 makes it difficult to extract an LED light-emitting die 2, therefore a die film expander is applied to expand an LED light-emitting die film uniformly, such that the LED light-emitting dice 2 densely attached to the surface of the LED light-emitting die film are evenly separated, which will be easy to extract and use;

cleaning and baking: a plasma cleaning machine is applied to perform plasma cleaning on the SMD LED lamp bead bracket matrix, wherein the residual organic substance on the surface of the SMD LED lamp bead bracket matrix is removed with an electric arc formed by hydrogen and oxygen inside the plasma cleaning machine to improve the adhesion of the LED light-emitting die 2, and then the SMD LED lamp bead bracket matrix is baked in an oven to remove the residual water vapor on its surface which is generated in the injection molding process;

warming: the insulating glue 3 which has been stored in a refrigerator is taken out and left to stand in the air to warm to room temperature;

Step 1.2: die bonding, also called chip mounting. A die bonder is used to fix an LED light-emitting die 2 of the LED light-emitting die film onto a designated position on the inner bottom surface of each SMD LED lamp bead bracket 1 in the SMD LED lamp bead bracket matrix via the insulating glue 3 to form a thermal path or an electric path, laying the foundation for the subsequent wire bonding;

Step 1.3: bonded-die baking. The semi-finished product formed in Step 1.2 is baked in an oven or a drying box, wherein the insulating glue 3 is baked and cured to establish a strong bond between the LED light-emitting die 2 and the SMD LED lamp bead bracket 1;

Step 1.4: soldering wires 4 in each SMD LED lamp bead bracket 1 with a wire bonder (also called bonding or wire bonding) and connecting the electrodes of the LED light-emitting die 2 with the conductive area on the inner bottom surface of the SMD LED lamp bead bracket 1 to form an electric path, wherein the wires 4 are gold wires.

In Step 3, the wires 4 are immersed in the first light-transmitting glue 5; before Step 6 is taken, an LED tester is applied to check and test the function of the SMD LED lamp beads;

Step 6 is completed with a cutting die;

after Step 8 is completed, a vacuum packaging machine is applied to vacuum package the SMD LED lamp beads which have been taped;

the cutter is a laser cutter;

and the first light-transmitting glue 5 is made of epoxy resin, and the polarizing film 6 is a leftward polarizing film.

Embodiment 2

Figure 2:
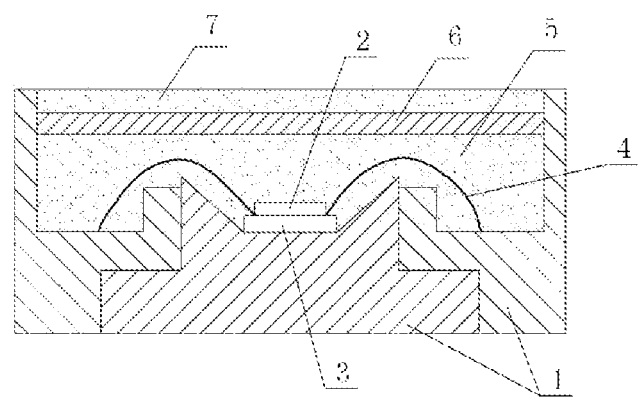
FIG. 2 is a second schematic structure diagram of a polarized-light-emitting SMD LED lamp bead.

Referring to FIG. 2, the reference numerals in the figure which are the same as those in Embodiment 1 share the meaning with them. The identicalnesses are omitted while the differences are as follows:

In a polarized-light-emitting SMD LED lamp bead (TOP type), the upper surface of the polarizing film 6 is covered with a layer of cured second light-transmitting glue 7.

The second light-transmitting glue 7 is made of epoxy resin, and the polarizing film 6 is disposed inside the SMD LED lamp bead bracket 1.

The method of batch manufacturing the polarized-light-emitting SMD LED lamp beads (TOP type) comprises the following steps:

Step 21: mounting an LED light-emitting die 2 onto the inner bottom surface of each SMD LED lamp bead bracket 1 in an SMD LED lamp bead bracket matrix, and connecting the electrodes of the LED light-emitting die 2 with the conductive area on the inner bottom surface of the SMD LED lamp bead bracket 1 to form an electric path; and interconnecting all the SMD LED lamp bead brackets 1 in the SMD LED lamp bead bracket matrix, wherein each SMD LED lamp bead bracket 1 is labeled with a direction-signifying mark;

Step 22: preheating the semi-finished product formed in Step 21;

Step 23: filling first light-transmitting glue 5 into each SMD LED lamp bead bracket 1 with a glue dispenser until the LED light-emitting die 2 is immersed in the first light-transmitting glue 5, wherein the surface of the first light-transmitting glue 5 is kept horizontal;

Step 24: placing a small piece of polarizing film from a taped polarizing film onto the surface of the first light-transmitting glue 5 in the SMD LED lamp bead bracket 1 with a surface mounter to form a polarizing film 6 on the surface of the first light-transmitting glue, wherein the height of the surface of the first light-transmitting glue 5 allows the polarizing film 6 to be disposed inside the SMD LED lamp bead bracket 1;

The method of manufacturing a taped polarizing film comprises the following steps: placing a whole polarizing film without glue on the front and back surfaces into a cutter, cutting the whole polarizing film into small pieces of polarizing film with the same size according to a preset program, wherein each small piece of polarizing film in the polarizing film matrix matches the SMD LED lamp bead bracket 1 in terms of shape and size (the small piece of polarizing film is a square piece with a surface area of 2 square millimeters) and is labeled with a direction-signifying mark, and then taping all the small polarizing film pieces with a taping machine to form a taped polarizing film; and the direction-signifying marks can ensure that all the taped polarizing films 6 have the same polarization direction during the taping process, such that the polarizing films 6 mounted in each SMD LED lamp bead bracket 1 with the surface mounter have the same direction;

Step 25: coating the polarizing film 6 in each SMD LED lamp bead bracket 1 with a layer of second light-transmitting glue 7 by a glue dispenser, and baking it to cure the second light-transmitting glue 7 in the SMD LED lamp bead bracket 1; and the second light-transmitting glue 7 not only transmits light, but also fixes and protects the polarizing film 6;

As the polarizing film 6 will be depolarized, that is, the polarity is lost, when temperature exceeds a certain value, the temperature and duration during the baking process should be precisely controlled according to the features of the polarizing film 6 and cannot exceed its tolerable temperature and duration;

Step 26: disconnecting the SMD LED lamp bead brackets from each other to form independent SMD LED lamp beads;

Step 27 binning the SMD LED lamp beads into different types with a splitter; by setting various parameters (brightness, voltage, color temperature, luminous flux, etc.) on the splitter, the SMD LED lamp beads can be binned into a plurality of classes and models;

Step 28: taping different types of SMD LED lamp beads separately with a taping machine.

The detailed method of Step 21 is:

Step 21.1: making preparations, including die film expanding, cleaning and baking, and warming;

die film expanding: a die film expander is applied to expand an LED light-emitting die film uniformly, such that the LED light-emitting dice 2 densely attached to the surface of the LED light-emitting die film are evenly separated;

cleaning and baking: a plasma cleaning machine is applied to perform plasma cleaning on the SMD LED lamp bead bracket matrix, wherein the residual organic substance on the surface of the SMD LED lamp bead bracket matrix is removed, and then the SMD LED lamp bead bracket matrix is baked in an oven to remove the water vapor on its surface;

warming: the insulating glue 3 which has been stored in a refrigerator is taken out and left to stand in the air to warm to room temperature;

Step 21.2: die bonding. A die bonder is used to fix an LED light-emitting die 2 of the LED light-emitting die film onto a designated position on the inner bottom surface of each SMD LED lamp bead bracket 1 in the SMD LED lamp bead bracket matrix via the insulating glue 3;

Step 21.3: bonded-die baking. The semi-finished product formed in Step 21.2 is baked in an oven or a drying box, wherein the insulating glue 3 is baked and cured to establish a strong bond between the LED light-emitting die 2 and the SMD LED lamp bead bracket 1;

Step 21.4: soldering wires 4 in each SMD LED lamp bead bracket 1 with a wire bonder and connecting the electrodes of the LED light-emitting die 2 with the conductive area on the inner bottom surface of the SMD LED lamp bead bracket 1 to form an electric path, wherein the wires 4 are gold wires.

In Step 23, the wires 4 are immersed in the first light-transmitting glue 5; in Step 24, the direction-signifying mark on the small polarizing film pieces is a notch;

before Step 26 is taken, an LED tester is applied to check and test the function of the SMD LED lamp beads;

Step 26 is completed with a cutting die;

after Step 28 is completed, a vacuum packaging machine is applied to vacuum package the SMD LED lamp beads which have been taped;

the cutter is a laser cutter;

the first light-transmitting glue 5 is made of epoxy resin, and the polarizing film 6 is a leftward polarizing film;

the first light-transmitting glue 5 can be cured naturally in a long period of time without baking;

and the second light-transmitting glue 7 is made of epoxy resin.

Embodiment 3

Figure 3:
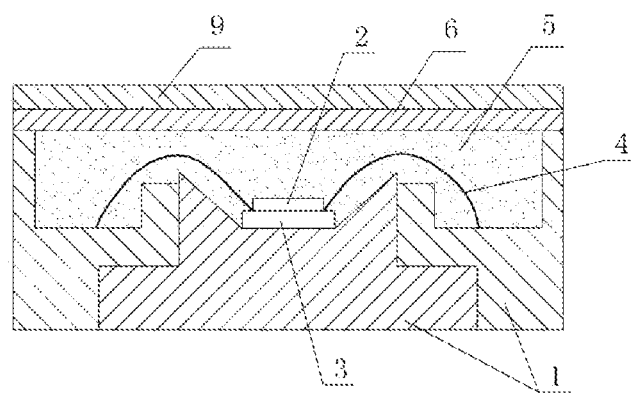
FIG. 3 is a third schematic structure diagram of a polarized-light-emitting SMD LED lamp bead.

Referring to FIG. 3, the reference numerals in the figure which are the same as those in Embodiment 1 share the meaning with them. The identicalnesses are omitted while the differences are as follows:

In a polarized-light-emitting SMD LED lamp bead (TOP type), the upper surface of the polarizing film 6 is covered with a light-transmitting film 9.

The light-transmitting film 9 is an AGAR film.

In the method of batch manufacturing the polarized-light-emitting SMD LED lamp beads (TOP type), the following operations are added between Step 5 and Step 6: extracting a small piece of light-transmitting film from a light-transmitting film matrix with a surface mounter, and pasting it onto the polarizing film 6 on the SMD LED lamp bead bracket 1 to form a light-transmitting film 9 on the surface of the polarizing film 6;

a light-transmitting film matrix is made of a whole light-transmitting film with a second bottom film, wherein the whole light-transmitting film is pasted to the second bottom film via the glue on the lower surface of the light-transmitting film, and the method of manufacturing the light-transmitting film matrix comprises the following steps: placing a whole light-transmitting film with a second bottom film into a cutter, cutting the whole light-transmitting film into neatly-aligned small pieces of light-transmitting film according to a preset program, and forming a light-transmitting film matrix, wherein each small piece of light-transmitting film in the light-transmitting film matrix matches the SMD LED lamp bead bracket 1 in terms of shape and size, the second bottom film remains uncut and the light-transmitting film matrix remains pasted to the upper surface of the second bottom film;

when selecting a whole light-transmitting film with a second bottom film, the second bottom film with too strong adhesion to the whole light-transmitting film should be excluded such that the extraction of the small light-transmitting film pieces is not impacted;

when cutting a whole light-transmitting film, the cutting depth of the cutter should be controlled to avoid cutting the second bottom film and to keep its integrity;

and the light-transmitting film 9 not only transmits light, but also protects the polarizing film 6.

Embodiment 4

Figure 4:
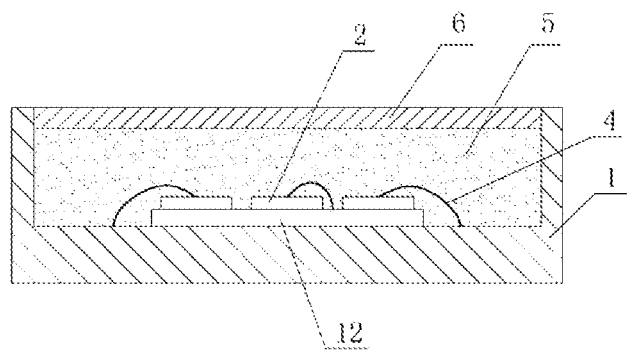
FIG. 4 is a fourth schematic structure diagram of a polarized-light-emitting SMD LED lamp bead.

Referring to FIG. 4, a polarized-light-emitting SMD LED lamp bead (TOP type) comprises an SMD LED lamp bead bracket 1 and three LED light-emitting dice 2 (emitting red, green and blue light respectively), wherein the three LED light-emitting dice 2 are disposed on the inner bottom surface of the SMD LED lamp bead bracket 1, a polarizing film 6 is horizontally disposed above the three LED light-emitting dice 2, and a gap between the inner bottom surface of the SMD LED lamp bead bracket 1 and the lower surface of the polarizing film 6 is filled with cured first light-transmitting glue 5.

The three LED light-emitting dice 2 are normal dice and are fixed onto the inner bottom surface of the SMD LED lamp bead bracket 1 through conductive glue 12, wherein three wires 4 connect the three LED light-emitting dice 2 with the inner bottom surface of the SMD LED lamp bead bracket 1, the common electrode of the three LED light-emitting dice 2 is connected with the inner bottom surface of the SMD LED lamp bead bracket 1 through conductive glue 12, and the other electrodes of the three LED light-emitting dice 2 are respectively connected to the inner bottom surface of the SMD LED lamp bead bracket 1 through the three wires 4 which are disposed below the polarizing film 6; the conductive glue 12 is silver glue; and the wires 4 are alloy wires.

The first light-transmitting glue 5 is made of silica gel; and the polarizing film 6 is a rightward polarizing film, which is disposed inside the SMD LED lamp bead bracket 1.

The method of batch manufacturing the polarized-light-emitting SMD LED lamp beads (TOP type) comprises the following steps:

Step 1: mounting three LED light-emitting dice 2 onto the inner bottom surface of each SMD LED lamp bead bracket 1 in an SMD LED lamp bead bracket matrix, and connecting the electrodes of the three LED light-emitting dice 2 with the conductive area on the inner bottom surface of the SMD LED lamp bead bracket 1 to form an electric path; and interconnecting all the SMD LED lamp bead brackets 1 in the SMD LED lamp bead bracket matrix, wherein each SMD LED lamp bead bracket 1 is labeled with a direction-signifying mark;

Step 2: preheating the semi-finished product formed in Step 1;

preheating is performed in an oven or a drying box to preheat the semi-finished product formed in Step 1 to a proper temperature, such that the first light-transmitting glue 5 is better combined with the SMD LED lamp bead bracket 1 to avoid the production of bubbles and other impurities in the packaging process;

Step 3: filling first light-transmitting glue 5 into each SMD LED lamp bead bracket 1 with a glue dispenser until the three LED light-emitting dice 2 are all immersed in the first light-transmitting glue 5, wherein the surface of the first light-transmitting glue 5 is kept horizontal;

Step 4: baking the semi-finished product formed in Step 3 to cure the first light-transmitting glue 5 filled in each SMD LED lamp bead bracket 1;

Step 5: extracting a small piece of polarizing film from a polarizing film matrix with a surface mounter, and pasting it onto the surface of the first light-transmitting glue 5 in the SMD LED lamp bead bracket 1 to form a polarizing film 6 on the surface of the first light-transmitting glue 5;

a polarizing film matrix is made of a whole polarizing film with a first bottom film, wherein the whole polarizing film is pasted to the first bottom film via the glue on the lower surface of the polarizing film. The method of manufacturing a polarizing film matrix comprises the following steps: placing a whole polarizing film with a first bottom film into a cutter, cutting the whole polarizing film into neatly-aligned small pieces of polarizing film according to a preset program, and forming a polarizing film matrix, wherein each small piece of polarizing film in the polarizing film matrix matches the SMD LED lamp bead bracket 1 in terms of shape and size (the small piece of polarizing film is a rectangular piece with a surface area of 3 square millimeters), the first bottom film remains uncut and the polarizing film matrix remains pasted to the upper surface of the first bottom film;

when selecting a whole polarizing film with a first bottom film, the first bottom film with too strong adhesion to the whole polarizing film should be excluded such that the extraction of the small polarizing film pieces is not impacted;

when cutting a whole polarizing film, the cutting depth of the cutter should be controlled to avoid cutting the first bottom film and to keep its integrity;

Step 6: disconnecting the SMD LED lamp bead brackets 1 from each other to form independent SMD LED lamp beads;

Step 7: binning the SMD LED lamp beads into different types with a splitter;

by setting various parameters (brightness, voltage, color temperature, luminous flux, etc.) on the splitter, the SMD LED lamp beads can be binned into a plurality of classes and models;

Step 8: taping different types of SMD LED lamp beads separately with a taping machine.

As the SMD LED lamp bead bracket 1 is labeled with a direction-signifying mark, the taped SMD LED lamp beads are in the same polarization direction.

In Step 5, the first bottom film is an expandable film, and after the polarizing film matrix is made, the expandable film is uniformly expanded with an expander to evenly separate the small pieces of polarizing film densely attached to the surface of the expandable film, which makes it easier to extract the small polarizing film pieces.

The detailed method of Step 1 is:

Step 1.1: making preparations, including die film expanding, cleaning and baking, and warming;

die film expanding: as an LED light-emitting die 2 is tiny (for example 4 μm*6 μm), the surface of an LED light-emitting die film supplied by its manufacturers is densely covered with tens of thousands of LED light-emitting dice 2; the tiny space between the LED light-emitting dice 2 makes it difficult to extract an LED light-emitting die 2, therefore a die film expander is applied to expand an LED light-emitting die film uniformly, such that the LED light-emitting dice 2 densely attached to the surface of the LED light-emitting die film are evenly separated, which will be easy to extract and use;

cleaning and baking: a plasma cleaning machine is applied to perform plasma cleaning on the SMD LED lamp bead bracket matrix, wherein the residual organic substance on the surface of the SMD LED lamp bead bracket matrix is removed with an electric arc formed by hydrogen and oxygen inside the plasma cleaning machine to improve the adhesion of the LED light-emitting die 2, and then the SMD LED lamp bead bracket matrix is baked in an oven to remove the residual water vapor on its surface which is generated in the injection molding process;

warming: the conductive glue 12 which has been stored in a refrigerator is taken out and left to stand in the air to warm to room temperature; and the conductive glue 12 is silver glue;

Step 1.2: die bonding, also called chip mounting. A die bonder is used to fix three LED light-emitting dice 2 of the LED light-emitting die film onto a designated positions on the inner bottom surface of each SMD LED lamp bead bracket 1 in the SMD LED lamp bead bracket matrix via conductive glue 12 to form a thermal path or an electric path, laying the foundation for the subsequent wire bonding;

Step 1.3: bonded-die baking. The semi-finished product formed in Step 1.2 is baked in an oven or a drying box, wherein the conductive glue 12 is baked and cured to establish a strong bond between the LED light-emitting dice 2 and the SMD LED lamp bead bracket 1;

Step 1.4: soldering the wires 4 in each SMD LED lamp bead bracket 1 by a wire bonder (also called bonding or wire bonding) and connecting the electrodes of the three LED light-emitting dice 2 with the conductive area on the inner bottom surface of the SMD LED lamp bead bracket 1 to form an electric path, wherein the wires 4 are alloy wires.

In Step 3, the wires 4 are immersed in the first light-transmitting glue 5;

before Step 6 is taken, an LED tester is applied to check and test the function of the SMD LED lamp beads;

Step 6 is completed with a punch press;

after Step 8 is completed, a vacuum packaging machine is applied to vacuum package the SMD LED lamp beads which have been taped;

the cutter is a mechanical cutter;

and the first light-transmitting glue 5 is made of silica gel, and the polarizing film 6 is a rightward polarizing film.

Embodiment 5

Figure 5:
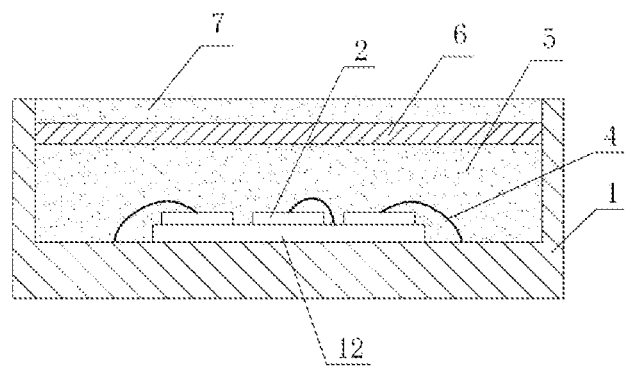
FIG. 5 is a fifth schematic structure diagram of a polarized-light-emitting SMD LED lamp bead.

Referring to FIG. 5, the reference numerals in the figure which are the same as those in Embodiment 4 share the meaning with them. The identicalnesses are omitted while the differences are as follows:

In a polarized-light-emitting SMD LED lamp bead (TOP type), the upper surface of the polarizing film 6 is covered with a layer of cured second light-transmitting glue 7.

The second light-transmitting glue 7 is UV glue.

The method of batch manufacturing the polarized-light-emitting SMD LED lamp beads (TOP type) comprises the following steps:

Step 21: mounting three LED light-emitting dice 2 (emitting red, green and blue light respectively) onto the inner bottom surface of each SMD LED lamp bead bracket 1 in an SMD LED lamp bead bracket matrix, and connecting the electrodes of the three LED light-emitting dice 2 with the conductive area on the inner bottom surface of the SMD LED lamp bead bracket 1 to form an electric path; and interconnecting all the SMD LED lamp bead brackets 1 in the SMD LED lamp bead bracket matrix, wherein each SMD LED lamp bead bracket 1 is labeled with a direction-signifying mark;

Step 22: preheating the semi-finished product formed in Step 21;

Step 23: filling first light-transmitting glue 5 into each SMD LED lamp bead bracket 1 with a glue dispenser until the three LED light-emitting dice 2 are all immersed in the first light-transmitting glue 5, wherein the surface of the first light-transmitting glue 5 is kept horizontal;

Step 24: placing a small piece of polarizing film from a taped polarizing film onto the surface of the first light-transmitting glue 5 in the SMD LED lamp bead bracket 1 with a surface mounter to form a polarizing film 6 on the surface of the first light-transmitting glue, wherein the height of the surface of the first light-transmitting glue 5 allows the polarizing film 6 to be disposed inside the SMD LED lamp bead bracket 1;

The method of manufacturing a taped polarizing film comprises the following steps: placing a whole polarizing film without glue on the front and back surfaces into a cutter, cutting the whole polarizing film into small pieces of polarizing film with the same size according to a preset program, wherein each small piece of polarizing film in the polarizing film matrix matches the SMD LED lamp bead bracket 1 in terms of shape and size (the small piece of polarizing film is a rectangular piece with a surface area of 3 square millimeters) and is labeled with a direction-signifying mark, and then taping all the small polarizing film pieces with a taping machine to form a taped polarizing film; and the direction-signifying marks can ensure that all the taped polarizing films 6 have the same polarization direction during the taping process, such that the polarizing films 6 mounted in each SMD LED lamp bead bracket 1 with the surface mounter have the same direction;

Step 25: coating the polarizing film 6 in each SMD LED lamp bead bracket 1 with a layer of second light-transmitting glue 7 by a glue dispenser, and exposing it to ultraviolet rays to cure the second light-transmitting glue 7 in the SMD LED lamp bead bracket 1; and the second light-transmitting glue 7 not only transmits light, but also fixes and protects the polarizing film 6;

Step 26: disconnecting the SMD LED lamp bead brackets from each other to form independent SMD LED lamp beads;

Step 27: binning the SMD LED lamp beads into different types with a splitter;

by setting various parameters (brightness, voltage, color temperature, luminous flux, etc.) on the splitter, the SMD LED lamp beads can be binned into a plurality of classes and models;

Step 28: taping different types of SMD LED lamp beads separately with a taping machine.

The detailed method of Step 21 is:

Step 21.1: making preparations, including die film expanding, cleaning and baking, and warming;

die film expanding: a die film expander is applied to expand an LED light-emitting die film uniformly, such that the LED light-emitting dice 2 densely attached to the surface of the LED light-emitting die film are evenly separated;

cleaning and baking: a plasma cleaning machine is applied to perform plasma cleaning on the SMD LED lamp bead bracket matrix, wherein the residual organic substance on the surface of the SMD LED lamp bead bracket matrix is removed, and then the SMD LED lamp bead bracket matrix is baked in an oven to remove the water vapor on its surface;

warming: the conductive glue 12 which has been stored in a refrigerator is taken out and left to stand in the air to warm to room temperature; and the conductive glue 12 is silver glue;

Step 21.2: die bonding. A die bonder is used to fix three LED light-emitting dice 2 of the LED light-emitting die film onto a designated positions on the inner bottom surface of each SMD LED lamp bead bracket 1 in the SMD LED lamp bead bracket matrix via the conductive glue 12;

Step 21.3: bonded-die baking. The semi-finished product formed in Step 21.2 is baked in an oven or a drying box, wherein the conductive glue 12 is baked and cured to establish a strong bond between the LED light-emitting dice 2 and the SMD LED lamp bead bracket 1;

Step 21.4: soldering the wires 4 in each SMD LED lamp bead bracket 1 by a wire bonder and connecting the electrodes of the three LED light-emitting dice 2 with the conductive area on the inner bottom surface of the SMD LED lamp bead bracket 1 to form an electric path, wherein the wires 4 are alloy wires.

In Step 23, the wires 4 are immersed in the first light-transmitting glue 5;

in Step 24, the direction-signifying mark on the small polarizing film pieces is a through hole;

before Step 26 is taken, an LED tester is applied to check and test the function of the SMD LED lamp beads;

Step 26 is completed with a punch press;

after Step 28 is completed, a vacuum packaging machine is applied to vacuum package the SMD LED lamp beads which have been taped;

the cutter is a mechanical cutter;

and the first light-transmitting glue 5 is made of silica gel, and the polarizing film 6 is a rightward polarizing film;

the first light-transmitting glue 5 can be cured naturally in a long period of time without baking;

and the second light-transmitting glue 7 is UV glue.

Embodiment 6

Figure 6:
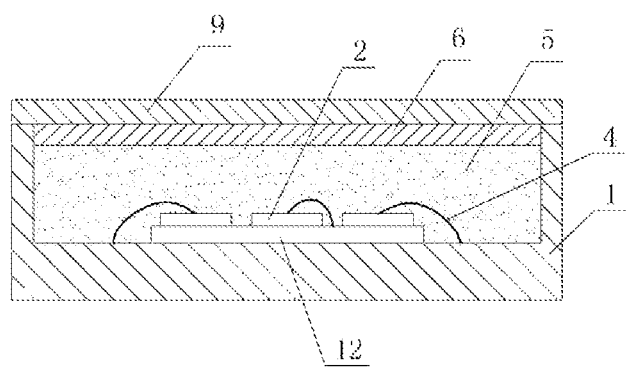
FIG. 6 is a sixth schematic structure diagram of a polarized-light-emitting SMD LED lamp bead.

Referring to FIG. 6, the reference numerals in the figure which are the same as those in Embodiment 4 share the meaning with them. The identicalnesses are omitted while the differences are as follows:

In a polarized-light-emitting SMD LED lamp bead (TOP type), the upper surface of the polarizing film 6 is covered with a light-transmitting film 9.

The light-transmitting film 9 is an AGAR film.

In the method of batch manufacturing the polarized-light-emitting SMD LED lamp beads (TOP type), the following operations are added between Step 5 and Step 6: extracting a small piece of light-transmitting film from a light-transmitting film matrix with a surface mounter, and pasting it onto the polarizing film 6 on the SMD LED lamp bead bracket 1 to form a light-transmitting film 9 on the surface of the polarizing film 6;

a light-transmitting film matrix is made of a whole light-transmitting film with a second bottom film, wherein the whole light-transmitting film is pasted to the second bottom film via the glue on the lower surface of the light-transmitting film, and the method of manufacturing the light-transmitting film matrix comprises the following steps: placing a whole light-transmitting film with a second bottom film into a cutter, cutting the whole light-transmitting film into neatly-aligned small pieces of light-transmitting film according to a preset program, and forming a light-transmitting film matrix, wherein each small piece of light-transmitting film in the light-transmitting film matrix matches the SMD LED lamp bead bracket 1 in terms of shape and size, the second bottom film remains uncut and the light-transmitting film matrix remains pasted to the upper surface of the second bottom film;

when selecting a whole light-transmitting film with a second bottom film, the second bottom film with too strong adhesion to the whole light-transmitting film should be excluded such that the extraction of the small light-transmitting film pieces is not impacted;

when cutting a whole light-transmitting film, the cutting depth of the cutter should be controlled to avoid cutting the second bottom film and to keep its integrity;

and the light-transmitting film 9 not only transmits light, but also protects the polarizing film 6.

Embodiment 7

Figure 7:
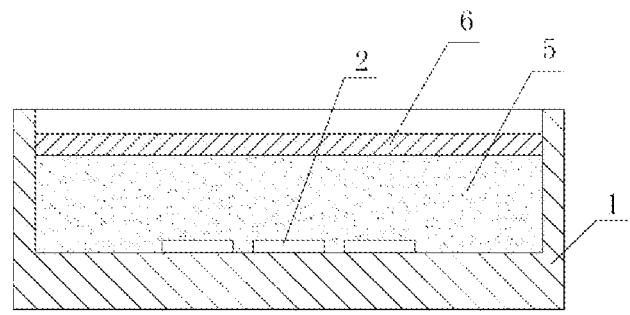
FIG. 7 is a seventh schematic structure diagram of a polarized-light-emitting SMD LED lamp bead.

Referring to FIG. 7, a polarized-light-emitting SMD LED lamp bead (TOP type) comprises an SMD LED lamp bead bracket 1 and three LED light-emitting dice 2, wherein the three LED light-emitting dice 2 are disposed on the inner bottom surface of the SMD LED lamp bead bracket 1, a polarizing film 6 is horizontally disposed above the three LED light-emitting dice 2, and a gap between the inner bottom surface of the SMD LED lamp bead bracket 1 and the lower surface of the polarizing film 6 is filled with cured first light-transmitting glue 5.

The three LED light-emitting dice 2 are flip-chip dice and are soldered onto the inner bottom of the SMD LED lamp bead bracket 1.

The first light-transmitting glue 5 is made of silica gel; and the polarizing film 6 is a linear polarizing film, which is disposed inside the SMD LED lamp bead bracket 1.

The method of batch manufacturing the polarized-light-emitting SMD LED lamp beads (TOP type) comprises the following steps:

Step 1: mounting three LED light-emitting dice 2 onto the inner bottom surface of each SMD LED lamp bead bracket 1 in an SMD LED lamp bead bracket matrix, and connecting the electrodes of the three LED light-emitting dice 2 with the conductive area on the inner bottom surface of the SMD LED lamp bead bracket 1 to form an electric path; and interconnecting all the SMD LED lamp bead brackets 1 in the SMD LED lamp bead bracket matrix, wherein each SMD LED lamp bead bracket 1 is labeled with a direction-signifying mark;

Step 2: preheating the semi-finished product formed in Step 1;

preheating is performed in an oven or a drying box to preheat the semi-finished product formed in Step 1 to a proper temperature, such that the first light-transmitting glue 5 is better combined with the SMD LED lamp bead bracket 1 to avoid the production of bubbles and other impurities in the packaging process;

Step 3: filling first light-transmitting glue 5 into each SMD LED lamp bead bracket 1 with a glue dispenser until the three LED light-emitting dice 2 are all immersed in the first light-transmitting glue 5, wherein the surface of the first light-transmitting glue 5 is kept horizontal;

Step 4: baking the semi-finished product formed in Step 3 to cure the first light-transmitting glue 5 filled in each SMD LED lamp bead bracket 1;

Step 5: extracting a small piece of polarizing film from a polarizing film matrix with a surface mounter, and pasting it onto the surface of the first light-transmitting glue 5 in the SMD LED lamp bead bracket 1 to form a polarizing film 6 on the surface of the first light-transmitting glue 5;

a polarizing film matrix is made of a whole polarizing film with a first bottom film, wherein the whole polarizing film is pasted to the first bottom film via the glue on the lower surface of the polarizing film. The method of manufacturing a polarizing film matrix comprises the following steps: placing a whole polarizing film with a first bottom film into a cutter, cutting the whole polarizing film into neatly-aligned small pieces of polarizing film according to a preset program, and forming a polarizing film matrix, wherein each small piece of polarizing film in the polarizing film matrix matches the SMD LED lamp bead bracket 1 in terms of shape and size (the small piece of polarizing film is a circular piece with a surface area of 4 square millimeters), the first bottom film remains uncut and the polarizing film matrix remains pasted to the upper surface of the first bottom film;

when selecting a whole polarizing film with a first bottom film, the first bottom film with too strong adhesion to the whole polarizing film should be excluded such that the extraction of the small polarizing film pieces is not impacted;

when cutting a whole polarizing film, the cutting depth of the cutter should be controlled to avoid cutting the first bottom film and to keep its integrity;

Step 6: disconnecting the SMD LED lamp bead brackets 1 from each other to form independent SMD LED lamp beads;

Step 7: binning the SMD LED lamp beads into different types with a splitter; by setting various parameters (brightness, voltage, color temperature, luminous flux, etc.) on the splitter, the SMD LED lamp beads can be binned into a plurality of classes and models;

Step 8: taping different types of SMD LED lamp beads separately with a taping machine.

As the SMD LED lamp bead bracket 1 is labeled with a direction-signifying mark, the taped SMD LED lamp beads are in the same polarization direction.

The detailed method of Step 1 is: soldering the three LED light-emitting dice 2 directly on the inner bottom surface of the SMD LED lamp bead bracket 1, and soldering the electrodes of the three LED light-emitting dice 2 with the conductive area on the inner bottom surface of the SMD LED lamp bead bracket 1 to form an electric path;

before Step 6 is taken, an LED tester is applied to check and test the function of the SMD LED lamp beads;

Step 6 is completed with a cutting die;

after Step 8 is completed, a vacuum packaging machine is applied to vacuum package the SMD LED lamp beads which have been taped;

the cutter is a mechanical cutter;

and the first light-transmitting glue 5 is made of silica gel, and the polarizing film 6 is a linear polarizing film.

Embodiment 8

Figure 8:
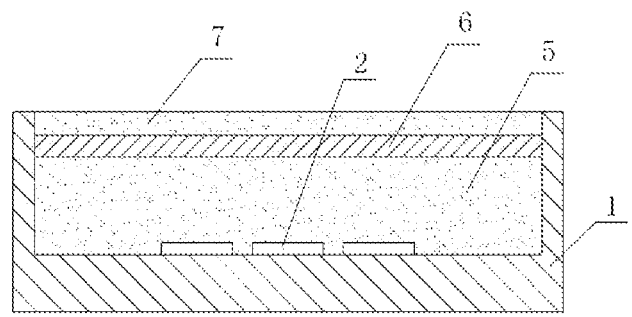
FIG. 8 is an eighth schematic structure diagram of a polarized-light-emitting SMD LED lamp bead.

Referring to FIG. 8, the reference numerals in the figure which are the same as those in Embodiment 7 share the meaning with them. The identicalnesses are omitted while the differences are as follows:

In a polarized-light-emitting SMD LED lamp bead (TOP type), the upper surface of the polarizing film 6 is covered with a layer of cured second light-transmitting glue 7.

The second light-transmitting glue 7 is made of silica gel.

In the method of batch manufacturing the polarized-light-emitting SMD LED lamp beads (TOP type), the following operations are added between Step 5 and Step 6: coating the polarizing film 6 in each SMD LED lamp bead bracket 1 with a layer of second light-transmitting glue 7 by a glue dispenser, and baking it to cure the second light-transmitting glue 7 in the SMD LED lamp bead bracket 1. The second light-transmitting glue 7 not only transmits light, but also protects the polarizing film 6.

As the polarizing film 6 will be depolarized, that is, the polarity is lost, when temperature exceeds a certain value, the temperature and duration during the baking process should be precisely controlled according to the features of the polarizing film 6 and cannot exceed its tolerable temperature and duration.

Embodiment 9

Figure 9:
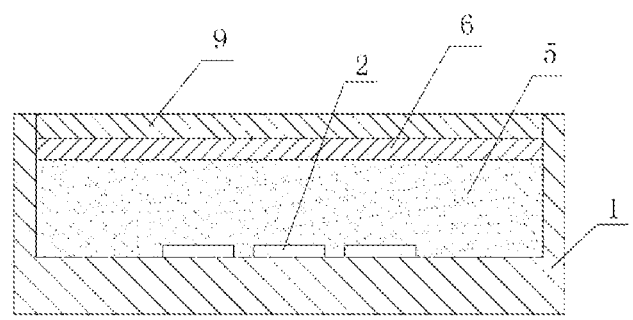
FIG. 9 is a ninth schematic structure diagram of a polarized-light-emitting SMD LED lamp bead.

Referring to FIG. 9, the reference numerals in the figure which are the same as those in Embodiment 7 share the meaning with them. The identicalnesses are omitted while the differences are as follows:

In a polarized-light-emitting SMD LED lamp bead (TOP type), the upper surface of the polarizing film 6 is covered with a light-transmitting film 9.

The light-transmitting film 9 is an AGAR film.

In the method of batch manufacturing the polarized-light-emitting SMD LED lamp beads (TOP type), the following operations are added between Step 5 and Step 6: extracting a small piece of light-transmitting film from a light-transmitting film matrix with a surface mounter, and pasting it onto the polarizing film 6 on the SMD LED lamp bead bracket 1 to form a light-transmitting film 9 on the surface of the polarizing film 6;

a light-transmitting film matrix is made of a whole light-transmitting film with a second bottom film, wherein the whole light-transmitting film is pasted to the second bottom film via the glue on the lower surface of the light-transmitting film, and the method of manufacturing the light-transmitting film matrix comprises the following steps: placing a whole light-transmitting film with a second bottom film into a cutter, cutting the whole light-transmitting film into neatly-aligned small pieces of light-transmitting film according to a preset program, and forming a light-transmitting film matrix, wherein each small piece of light-transmitting film in the light-transmitting film matrix matches the SMD LED lamp bead bracket 1 in terms of shape and size, the second bottom film remains uncut and the light-transmitting film matrix remains pasted to the upper surface of the second bottom film;

when selecting a whole light-transmitting film with a second bottom film, the second bottom film with too strong adhesion to the whole light-transmitting film should be excluded such that the extraction of the small light-transmitting film pieces is not impacted;

when cutting a whole light-transmitting film, the cutting depth of the cutter should be controlled to avoid cutting the second bottom film and to keep its integrity;

and the light-transmitting film 9 not only transmits light, but also protects the polarizing film 6.

What is claimed is:

1. A method of batch manufacturing a polarized-light-emitting SMD LED lamp beads, wherein the polarized-light-emitting SMD LED lamp beads comprises an SMD LED lamp bead bracket and N LED light-emitting die (dice) with N being a natural number greater than or equal to 1 and the N LED light-emitting die (dice) being disposed on the inner bottom surface of the SMD LED lamp bead bracket, wherein a polarizing film is horizontally disposed above the N LED light emitting die (dice), and the gap between the inner bottom surface of the SMD LED lamp bead bracket and the lower surface of the polarizing film is filled with cured first light-transmitting glue;

wherein the method comprises the following steps:

Step 1: mounting N LED light-emitting die (dice) onto the inner bottom surface of each SMD LED lamp bead bracket in an SMD LED lamp bead bracket matrix, and connecting the electrodes of the N LED light-emitting die (dice) with the conductive area on the inner bottom surface of the SMD LED lamp bead bracket to form an electric path, wherein N is a natural number greater than or equal to 1; and interconnecting all the SMD LED lamp bead brackets in the SMD LED lamp bead bracket matrix, wherein each SMD LED lamp bead bracket is labeled with a direction-signifying mark;

Step 2: preheating the semi-finished product formed in Step 1;

Step 3: filling first light-transmitting glue into each SMD LED lamp bead bracket with a glue dispenser until the N LED light-emitting die (dice) is (are) immersed in the first light-transmitting glue, wherein the surface of the first light-transmitting glue is kept horizontal;

Step 4: baking the semi-finished product formed in Step 3 to cure the first light-transmitting glue filled in each SMD LED lamp bead bracket;

Step 5: extracting a small piece of polarizing film from a polarizing film matrix with a surface mounter, and pasting it onto the surface of the first light-transmitting glue in the SMD LED lamp bead bracket to form a polarizing film on the surface of the first light-transmitting glue;

a polarizing film matrix is made of a whole polarizing film with a first bottom film, wherein the whole polarizing film is pasted to the first bottom film via the glue on the lower surface of the polarizing film; the method of manufacturing a polarizing film matrix comprises the following steps:

placing a whole polarizing film with a first bottom film into a cutter, cutting the whole polarizing film into neatly-aligned small pieces of polarizing film according to a preset program, and forming a polarizing film matrix, wherein each small piece of polarizing film in the polarizing film matrix matches the SMD LED lamp bead bracket in terms of shape and size, the first bottom film remains uncut and the polarizing film matrix remains pasted to the upper surface of the first bottom film;

Step 6: disconnecting the SMD LED lamp bead brackets from each other to form independent SMD LED lamp beads;

Step 7: binning the SMD LED lamp beads into different types with a splitter;

Step 8: taping different types of SMD LED lamp beads separately with a taping machine.

2. The method of batch manufacturing of claim 1, wherein, in Step 5, the first bottom film is an expandable film, and after the polarizing film matrix is made, the expandable film is uniformly expanded with an expander to evenly separate the small pieces of polarizing film densely attached to the surface of the expandable film.

3. The method of batch manufacturing of claim 1, wherein the following operations are added between Step 5 and Step 6: coating the polarizing film in each SMD LED lamp bead bracket with a layer of second light-transmitting glue by a glue dispenser, and baking it or exposing it to ultraviolet rays to cure the second light-transmitting glue in the SMD LED lamp bead bracket.

4. The method of batch manufacturing of claim 1, wherein the following operations are added between Step 5 and Step 6: extracting a small piece of light-transmitting film from a light-transmitting film matrix with a surface mounter, and pasting it onto the polarizing film on the SMD LED lamp bead bracket to form a light-transmitting film on the surface of the polarizing film;

a light-transmitting film matrix is made of a whole light-transmitting film with a second bottom film, wherein the whole light-transmitting film is pasted to the second bottom film via the glue on the lower surface of the light-transmitting film, and the method of manufacturing the light-transmitting film matrix comprises the following steps:

placing a whole light-transmitting film with a second bottom film into a cutter, cutting the whole light-transmitting film into neatly-aligned small pieces of light-transmitting film according to a preset program, and forming a light-transmitting film matrix, wherein each small piece of light-transmitting film in the light-transmitting film matrix matches the SMD LED lamp bead bracket in terms of shape and size, the second bottom film remains uncut and the light-transmitting film matrix remains pasted to the upper surface of the second bottom film.

5. The method of batch manufacturing of claim 1, wherein, when the LED light-emitting die is a normal die, the detailed method of Step 1 is:

Step 1.1: making preparations, including die film expanding, cleaning and baking, and warming; die film expanding: a die film expander is applied to expand an LED light-emitting die film uniformly, such that the LED light-emitting dice densely attached to the surface of the LED light-emitting die film are evenly separated; cleaning and baking: a plasma cleaning machine is applied to perform plasma cleaning on the SMD LED lamp bead bracket matrix, wherein the residual organic substance on the surface of the SMD LED lamp bead bracket matrix is removed, and then the SMD LED lamp bead bracket matrix is baked to remove the water vapor on its surface; warming: the conductive glue or the insulating glue which has been stored in a refrigerator is taken out and left to stand in the air to warm to room temperature;

Step 1.2: die bonding. A die bonder is used to fix an LED light-emitting die of the LED light-emitting die film onto a designated position on the inner bottom surface of each SMD LED lamp bead bracket in the SMD LED lamp bead bracket matrix via the conductive glue or insulating glue;

Step 1.3: bonded-die baking. The semi-finished product formed in Step 1.2 is baked, wherein the conductive glue or insulating glue is baked and cured to establish a strong bond between the LED light-emitting die and the SMD LED lamp bead bracket;

Step 1.4: soldering wires in each SMD LED lamp bead bracket with a wire bonder and connecting the electrodes of the N LED light-emitting die (dice) with the conductive area on the inner bottom surface of the SMD LED lamp bead bracket to form an electric path;

when the LED light-emitting die is a flip-chip die, the detailed method of Step 1 is: soldering the N LED light-emitting die (dice) directly onto the inner bottom surface of the SMD LED lamp bead bracket, and soldering the electrodes of the N LED light-emitting die (dice) with the conductive area on the inner bottom surface of the SMD LED lamp bead bracket to form an electric path;

in Step 3, the wires are immersed in the first light-transmitting glue;

before Step 6 is taken, an LED tester is applied to check and test the function of the SMD LED lamp beads;

Step 6 is completed with a cutting die or a punch press;

after Step 8 is completed, a vacuum packaging machine is applied to vacuum package the SMD LED lamp beads which have been taped;

the cutter is a laser or mechanical cutter;

the first light-transmitting glue is made of epoxy resin or silica gel, and the polarizing film is a leftward, rightward or linear polarizing film;

and N is 1~3.

6. A method of batch manufacturing the polarized-light-emitting SMD LED lamp beads, wherein the polarized-light-emitting SMD LED lamp beads comprises an SMD LED lamp bead bracket and N LED light-emitting die (dice) with N being a natural number greater than or equal to 1 and the N LED light-emitting die (dice) being disposed on the inner bottom surface of the SMD LED lamp bead bracket, wherein a polarizing film is horizontally disposed above the N LED light emitting die (dice), and the gap between the inner bottom surface of the SMD LED lamp bead bracket and the lower surface of the polarizing film is filled with cured first light-transmitting glue, and a layer of cured second light-transmitting glue or a second light-transmitting film is disposed on the upper surface of the polarizing film;

wherein the method comprises the following steps:

Step 21: mounting N LED light-emitting die (dice) onto the inner bottom surface of each SMD LED lamp bead bracket in an SMD LED lamp bead bracket matrix, and connecting the electrodes of the N LED light-emitting die (dice) with the conductive area on the inner bottom surface of the SMD LED lamp bead bracket to form an electric path, wherein N is a natural number greater than or equal to 1; and interconnecting all the SMD LED lamp bead brackets in the SMD LED lamp bead bracket matrix, wherein each SMD LED lamp bead bracket is labeled with a direction-signifying mark;

Step 22: preheating the semi-finished product formed in Step 21;

Step 23: filling first light-transmitting glue into each SMD LED lamp bead bracket with a glue dispenser until the N LED light-emitting die (dice) is (are) immersed in the first light-transmitting glue, wherein the surface of the first light-transmitting glue is kept horizontal;

Step 24: placing a small piece of polarizing film from a taped polarizing film onto the surface of the first light-transmitting glue in the SMD LED lamp bead bracket with a surface mounter to form a polarizing film on the surface of the first light-transmitting glue, wherein the height of the surface of the first light-transmitting glue allows the polarizing film to be disposed inside the SMD LED lamp bead bracket;

the method of manufacturing a taped polarizing film comprises the following steps: placing a whole polarizing film without glue on the front and back surfaces into a cutter, cutting the whole polarizing film into small pieces of polarizing film with the same size according to a preset program, wherein each small piece of polarizing film in the polarizing film matrix matches the SMD LED lamp bead bracket in terms of shape and size and is labeled with a direction-signifying mark, and then taping all the small polarizing film pieces with a taping machine to form a taped polarizing film;

Step 25: coating the polarizing film in each SMD LED lamp bead bracket with a layer of second light-transmitting glue by a glue dispenser, and baking it or exposing it to ultraviolet rays to cure the second light-transmitting glue in the SMD LED lamp bead bracket;

Step 26: disconnecting the SMD LED lamp bead brackets from each other to form independent SMD LED lamp beads;

Step 27: binning the SMD LED lamp beads into different types with a splitter;

Step 28: taping different types of SMD LED lamp beads separately with a taping machine.

7. The method of batch manufacturing of claim 6, wherein, when the LED light emitting die is a normal die, the detailed method of Step 21 is:

Step 21.1: making preparations, including die film expanding, cleaning and baking, and warming; die film expanding: a die film expander is applied to expand an LED light-emitting die film uniformly, such that the LED light-emitting dice densely attached to the surface of the LED light-emitting die film are evenly separated; cleaning and baking: a plasma cleaning machine is applied to perform plasma cleaning on the SMD LED lamp bead bracket matrix, wherein the residual organic substance on the surface of the SMD LED lamp bead bracket matrix is removed, and then the SMD LED lamp bead bracket matrix is baked to remove the water vapor on its surface; warming: the conductive glue or insulating glue which has been stored in a refrigerator is taken out and left to stand in the air to warm to room temperature;

Step 21.2: die bonding. A die bonder is used to fix an LED light-emitting die of the LED light-emitting die film onto a designated position on the inner bottom surface of each SMD LED lamp bead bracket in the SMD LED lamp bead bracket matrix via conductive glue or insulating glue;

Step 21.3: bonded-die baking. The semi-finished product formed in Step 21.2 is baked, wherein the conductive glue or insulating glue is baked and cured to establish a strong bond between the LED light-emitting die and the SMD LED lamp bead bracket;

Step 21.4: soldering wires in each SMD LED lamp bead bracket with a wire bonder and connecting the electrodes of the N LED light-emitting die (dice) with the conductive area on the inner bottom surface of the SMD LED lamp bead bracket to form an electric path;

when the LED light-emitting die is a flip-chip die, the detailed method of Step 21 is: soldering the N LED light-emitting die (dice) directly onto the inner bottom surface of the SMD LED lamp bead bracket, and soldering the electrodes of the N LED light-emitting die (dice) with the conductive area on the inner bottom surface of the SMD LED lamp bead bracket to form an electric path;

in Step 23, the wires are immersed in the first light-transmitting glue;

in Step 24, the direction-signifying mark on the small polarizing film pieces is a through hole or/and a notch;

before Step 26 is taken, an LED tester is applied to check and test the function of the SMD LED lamp beads;

Step 26 is completed with a cutting die or punch press;

after Step 28 is completed, a vacuum packaging machine is applied to vacuum package the SMD LED lamp beads which have been taped;

the cutter is a laser or mechanical cutter;

the first light-transmitting glue is made of epoxy resin or silica gel, and the polarizing film is a leftward, rightward or linear polarizing film; and the first light-transmitting glue is cured naturally;

the second light-transmitting glue is made of epoxy resin, silica gel or UV glue; and the epoxy resin and the silica gel are cured by baking while the UV glue is cured by ultraviolet irradiation;

and N is 1~3.

* * * * *